United States Patent
Zhang

(10) Patent No.: US 8,658,260 B2
(45) Date of Patent: Feb. 25, 2014

(54) LASER-INDUCED BACKSIDE ANNEALING USING FLUID ABSORBER

(75) Inventor: Jie Zhang, Boston, MA (US)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/453,518

(22) Filed: Apr. 23, 2012

(65) Prior Publication Data

US 2013/0280440 A1    Oct. 24, 2013

(51) Int. Cl.
  *B05D 3/02* (2006.01)
  *B05D 3/00* (2006.01)

(52) U.S. Cl.
  USPC .......................... 427/554; 427/555; 427/559

(58) Field of Classification Search
  None
  See application file for complete search history.

(56) References Cited

U.S. PATENT DOCUMENTS

| | | | | |
|---|---|---|---|---|
| 7,402,506 B2 * | 7/2008 | Levy et al. | ...................... | 438/584 |
| 7,837,823 B2 * | 11/2010 | Griffin et al. | .................. | 156/277 |
| 2008/0076226 A1 * | 3/2008 | Knutson et al. | ............... | 438/308 |
| 2009/0253273 A1 * | 10/2009 | Sano et al. | ..................... | 438/795 |

FOREIGN PATENT DOCUMENTS

EP    1468332 B1 *    3/2010    .............. G03F 7/004

* cited by examiner

*Primary Examiner* — Timothy Meeks
*Assistant Examiner* — Ina Agaj
(74) *Attorney, Agent, or Firm* — Harness, Dickey & Pierce, P.L.C.

(57) ABSTRACT

A coating material containing metal oxide is applied to one side of a substrate, both coating and substrate being transparent to visible light. An absorber material is placed in heat transfer proximity to the coating and a laser beam is transmitted through the substrate and through the coating to strike the absorber material at the interface between coating and absorber. The absorber material absorbs optical energy from the laser beam causing the material to heat. Heat from the absorber propagates to the coating to heat a localized region, causing the coating material to anneal. If desired, the coating material can include a doping material that fuses into the coating during annealing.

25 Claims, 6 Drawing Sheets

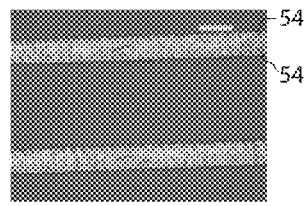 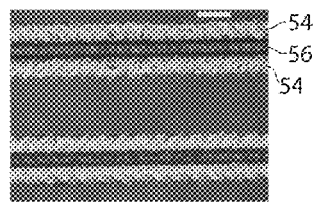 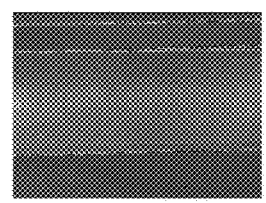
Fig. 5a　　　　　　Fig. 5b　　　　　　Fig. 5c
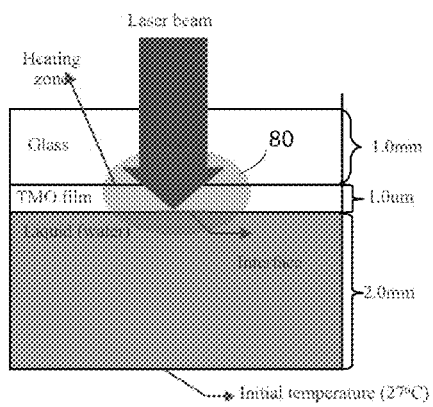
Fig. 6a
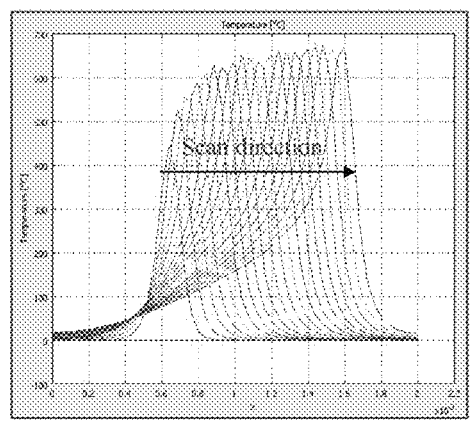 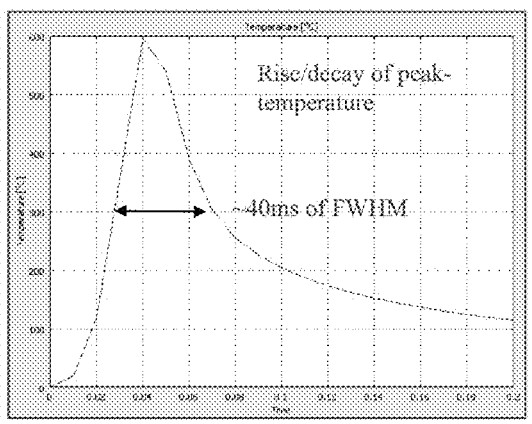
Fig. 6b　　　　　　Fig. 6c

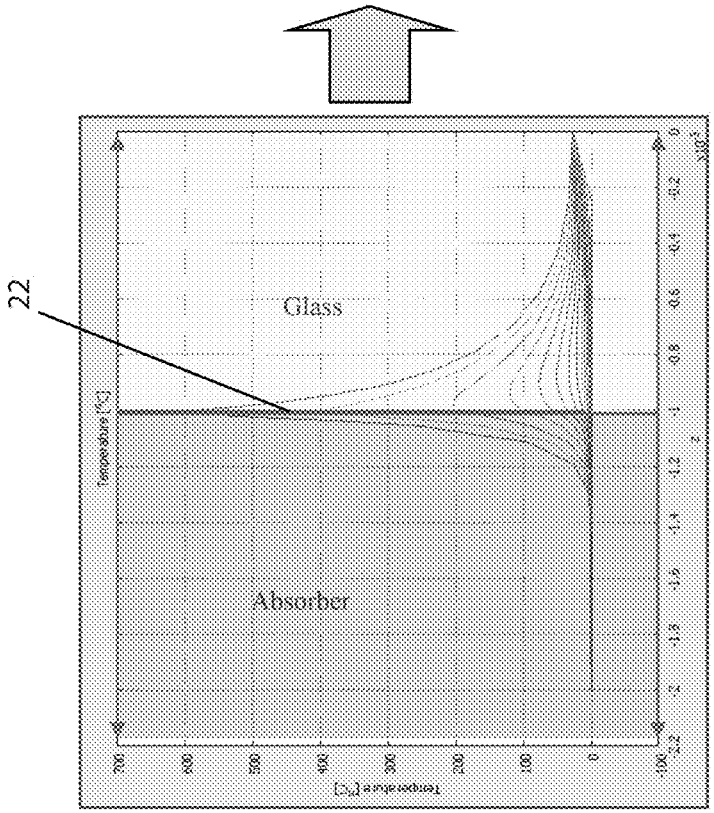
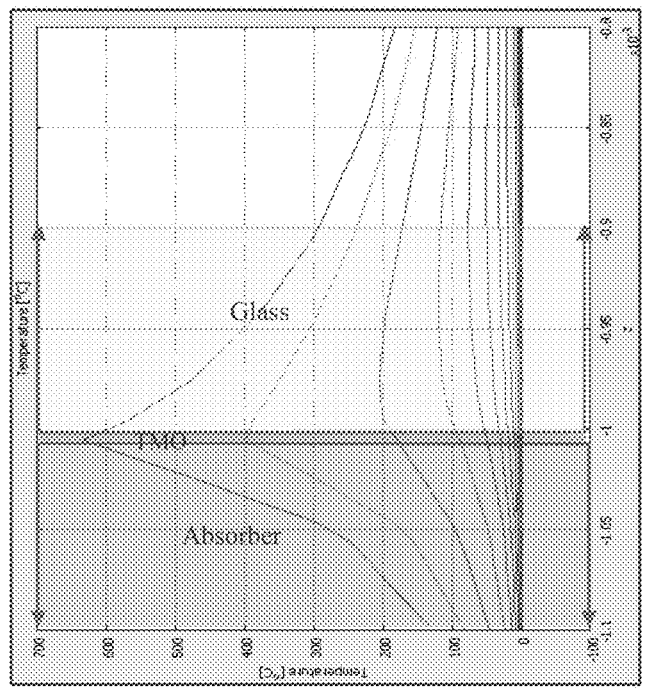
Fig. 7a
Fig. 7b

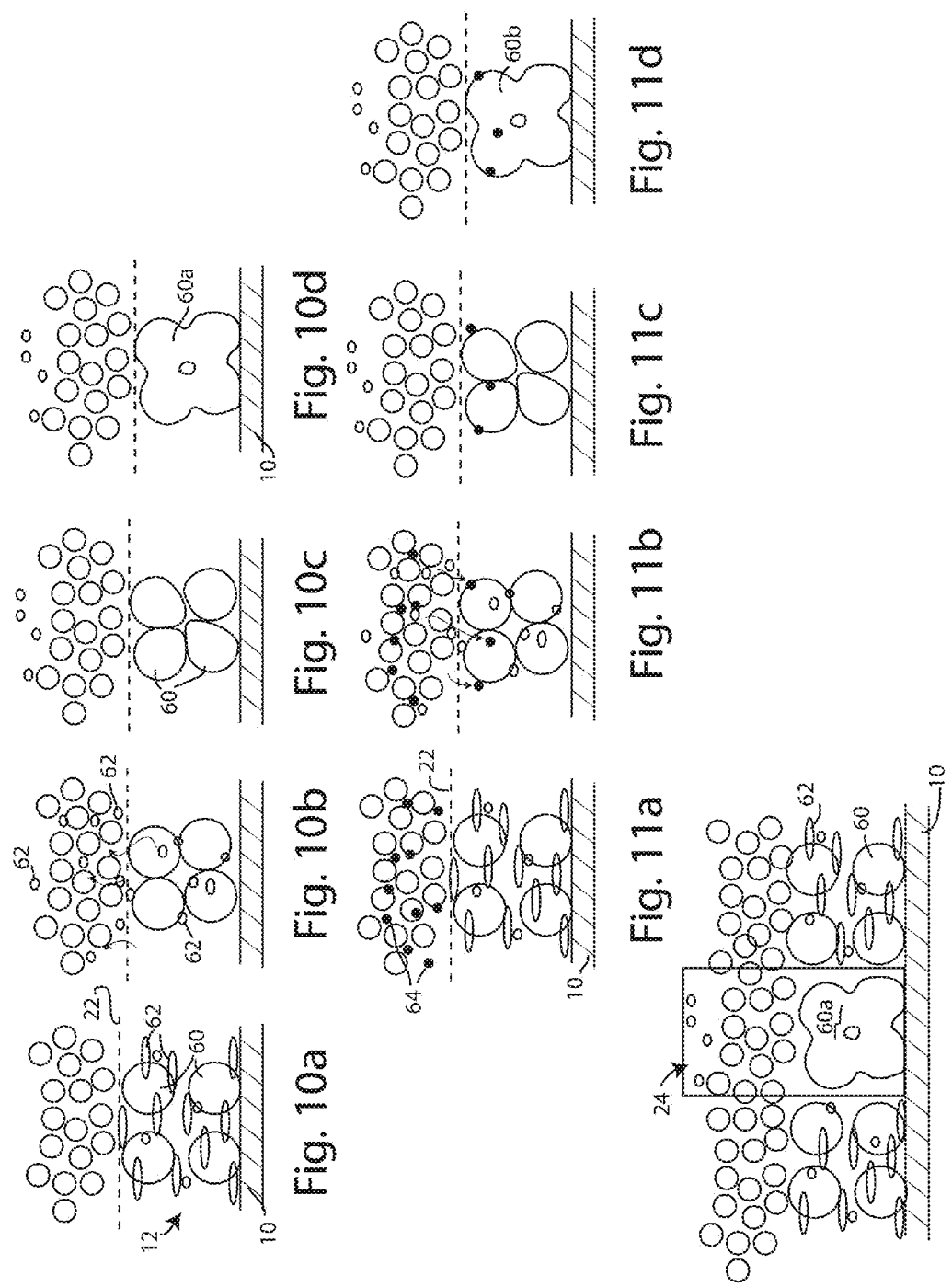

LASER-INDUCED BACKSIDE ANNEALING USING FLUID ABSORBER

FIELD

The present disclosure relates generally to fabrication techniques using laser processing. More particularly, the disclosure relates to annealing of transparent films deposited on transparent substrates by a laser-induced backside process.

BACKGROUND

This section provides background information related to the present disclosure which is not necessarily prior art.

Metal oxide thin films play a very important role in a variety of electronic devices that have transparent components, such as display devices, solar energy panels, and the like. For instance, the metal oxide thin film may define an operative part of a semiconductor device, such as the gate insulator and semiconductor of a thin film transistor, or it may define a conductive circuit path across the transparent face of the electronic device. In such applications, the metal oxide thin film, itself, may be transparent.

The conventional technique of solution-based processing for applying a metal oxide thin film to a transparent surface involves applying a coating of metal oxide ink to the transparent substrate and then annealing the metal oxide ink film by baking it in a furnace, as illustrated in FIG. 13. To achieve proper annealing, the furnace temperature must be greater than 400° C. with the annealing time on the order of 10's of minutes. Such high temperatures and such long baking times are not suitable for most plastic substrates and some temperature sensitive devices.

As an alternative to furnace annealing, some have tried using direct annealing using special lasers that direct optical energy onto the metal oxide ink film to cause localized heating as illustrated in FIG. 14. However, where the metal oxide ink film itself is transparent, most lasers have no heating effect; the laser beam simply passes through the transparent metal oxide thin film without transferring enough energy to the film to heat it to the annealing point. Thus, such direct annealing laser techniques require use of special lasers producing light at wavelengths that are absorbed by the transparent ink film or by the underlying substrate. Such lasers are expensive and difficult to work with because the light produced is outside the visible spectrum.

SUMMARY

This section provides a general summary of the disclosure, and is not a comprehensive disclosure of its full scope or all of its features.

The present disclosure employs a new technique that allows inexpensive, user-friendly lasers, including diode lasers, to anneal a transparent metal oxide ink film upon a transparent substrate. The method uses a laser-induced backside process employing a laser that provides a laser beam at a wavelength that is substantially transmissive through the substrate and through the coating material that includes the metal oxide. The metal oxide coating material is applied to a first surface of the transparent substrate to define a coated surface. A containment vessel is then associated with the coated surface to define a fluid containment chamber that includes within its interior at least a portion of the coated surface. Into this containment chamber a fluid absorber material is introduced, so that the fluid absorber material contacts at least a portion of the coated surface. The fluid absorber is selected such that it is substantially absorptive at the predetermined laser wavelength.

A laser beam is then transmitted through the substrate and also through the coating material to strike the absorber material at the interface between coating material and absorber. The laser beam delivers optical energy to the absorber causing it to gain heat in the region where it is struck by the beam. This heat is then allowed to propagate to a localized region of the coating material in a quantity sufficient to anneal the coating material adjacent the absorber-coating interface through which the beam passed.

By controlling parameters such as beam profile shape, wavelength, duration of illumination (e.g., speed at which beam and workpiece substrate move relative to one another), laser power and absorber chemistry, very precise thin films can be applied to the transparent substrate in a highly controlled manner, using low-cost, user-friendly lasers or laser diodes. If desired, the absorber chemistry can include doping materials to be introduced into the thin film as part of the annealing process.

The disclosed technique thus provides a method of applying a film to a substrate that involves applying a coating material to a front side of a substrate; placing an absorber material in heat transfer proximity to a backside of the substrate; using a laser to heat an absorber material by transmitting the laser beam first through the coating material and then through the substrate to supply optical energy to the absorber material; and using the heat from the absorber material to alter the physical properties of the coating material such that the coating material forms a film adhered to the substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5a is a surface image photograph of a substrate onto which an Indium-Tin-Oxide (ITO) film of two horizontal stripes has been annealed using a 405 nm blue laser diode;

FIG. 5b is a surface image photograph of a substrate onto which an ITO film of two horizontal stripes has been annealed using a 1064 nm fiber laser;

FIG. 5c is a surface image photograph of a substrate onto which an ITO film of one horizontal stripe has been annealed using a 1064 nm fiber laser with a beam having a top hat profile;

FIG. 6a depicts a heat simulation model useful in understanding the thermodynamics of the backside laser annealing process;

FIG. 6b depicts the peak-temperature at the interface during scanning;

FIG. 6c depicts the rise/decay of peak-temperature;

FIGS. 7a and 7b depict peak-temperature decay along the absorber-coating-substrate fabrication;

FIGS. 10a-10d illustrate how the metal oxide material is changed and volatile organic materials are driven off during the backside annealing process;

FIGS. 11a-11d illustrate how the metal oxide material is doped using constituents of the absorber material in an alternate embodiment;

FIG. 12 shows how the backside laser heated region differs from the non-heated region;

Corresponding reference numerals indicate corresponding parts throughout the several views of the drawings.

DETAILED DESCRIPTION

Example embodiments will now be described more fully with reference to the accompanying drawings.

Figure 1:
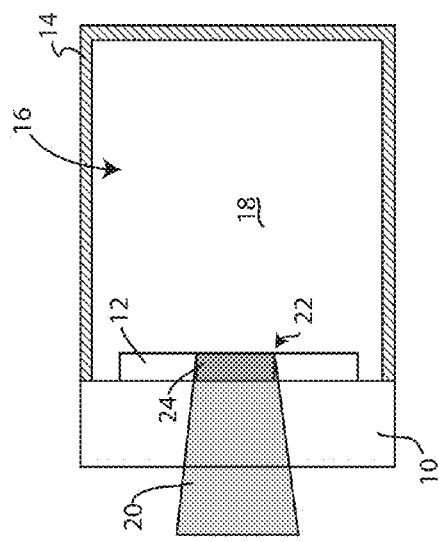
FIG. 1 is a cross-sectional view showing the disclosed method of applying a thin film to a transparent substrate.

The laser-induced backside process according to the present disclosure is shown schematically in FIG. 1. Begin with a substrate such as a transparent substrate 10. To the transparent substrate 10, apply a coating material 12 such as ink film. The ink film 12 preferably contains the metal oxide material to be attached by annealing, suspended in a solvent, such as an organic solvent. A suitable coating material can be fabricated from one or more metal oxides, such as those identified in FIGS. 4a and 4b; with the metal oxide being provided as nanoparticles mixed with a suitable organic ligand, or provided as a metal oxide compound colloidally suspended or otherwise mixed or chemically combined with an organic material using a sol-gel process or the like. The sol-gel process is a wet chemical technique in which the 'sol' (or solution) gradually evolves towards the formation of a gel-like diphasic system containing both a liquid phase and a solid phase whose morphologies range from discrete particles to continuous polymer networks.

A containment vessel 14 is associated with the coating material 12 to define a fluid containment chamber 16 that includes within its interior at least a portion of the coated surface of the substrate 10. An absorber material 18 is then introduced into chamber 16 so that it comes into contact with the coating material 12. The absorber material is preferably a fluid material, such as a liquid, that makes good thermal contact with the coating 12 and also inherently provides interstices through which outgassing organic byproducts may pass as the organic solvents are boiled away during the annealing process. The absorber material is composed of a heat absorbing material, such as dye or nanoparticles in a solvent. Carbon-based black-colored ink with an isopropanol solvent can serve as suitable absorber. Other materials and formulations may alternatively be used. The absorber material chosen may preferably be a good heat insulator, and preferably with a heat capacity that is similar to the coating material (metal oxide). The absorber material should also be selected so that it does not become substantially chemically altered at temperatures produced during laser heating.

To generate heat for the annealing process, a laser beam 20 is transmitted through the substrate 10 and also through the coating material 12 to strike the absorber material 18 at the interface between the coating material and the absorber. The laser beam thus strikes the absorber at the interface and supplies optical energy to the absorber, causing the absorber to gain heat in the region where struck. Energy is delivered to the absorber in this fashion until it attains a temperature sufficient to cause annealing within a localized region 24 of the coating material 12. Once a suitable annealing temperature has been achieved, the laser beam 20 may be terminated, or moved to a different region of the workpiece. In a typical implementation, the laser beam will be moved relative to the workpiece at a rate selected to control how long a particular region is heated. Because the absorber stores heat energy, heat will continue to flow from the absorber material to the localized region of the coating material even after the laser beam has been terminated; thus the annealing process continues even after the absorber material is no longer illuminated.

Figure 2:
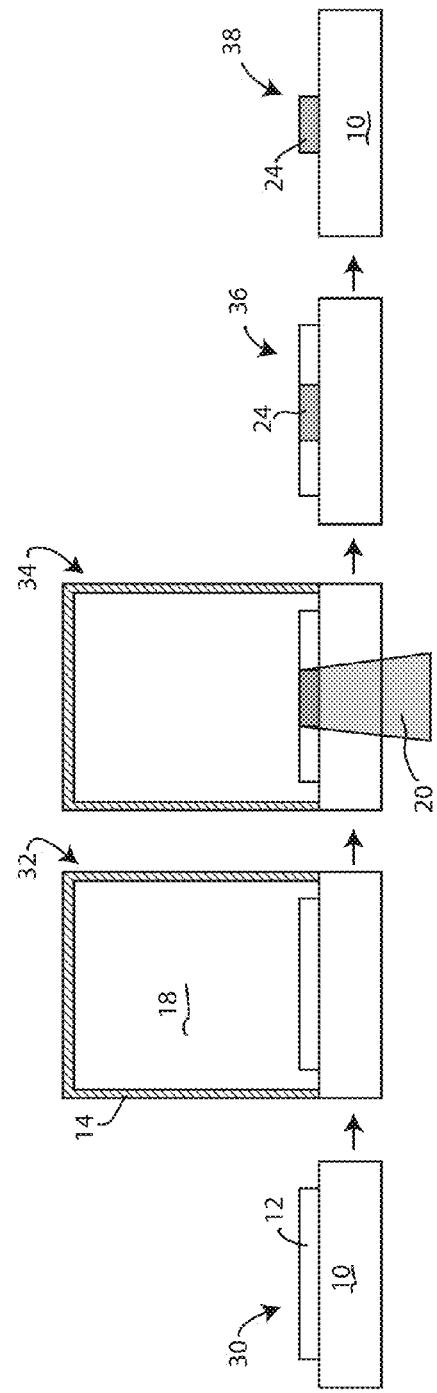
FIG. 2 is a flow diagram illustrating the steps involved in applying a thin film to a transparent substrate using the disclosed technique.

FIG. 2 shows an example of the backside laser annealing process in additional detail. As illustrated at 30, a coating material 12 of metal oxide ink, such as a material formulated using a sol-gel process, is painted or deposited onto the surface of substrate 10. While many different materials may potentially be used, the technique described here is particularly well suited for applying metal oxide coatings to transparent substrates of glass or plastic. For example, a metal oxide ink may be formulated by mixing metal oxide powder in a sol-gel medium to form a transparent ink that is then painted or sprayed onto the surface of the substrate. After painting the substrate with the metal oxide ink, the ink may be allowed to dry, if desired, using a low heat that will not damage the substrate. Alternatively, the coating material 12 may comprise metal oxide nanoparticles held together by an organic ligand. In this alternate case, the metal oxide nanoparticle ink is painted or sprayed onto the surface and then allowed to dry, optionally using a low heat to speed up the drying process.

The substrate with coating is then installed in the containment vessel 14 as shown at 32 and the vessel is filled with a suitable quantity of absorber material 18 to substantially cover the ink film in the region where annealing is desired. The material chosen for the absorber may depend on the wavelength of the laser light chosen. In the illustrated embodiment, a carbon-based black-colored ink with IPA isopropanol solvent was used as the absorber material. This absorber material is substantially non-transmissive (opaque) at both 1064 nm and 405 nm laser wavelengths. These wavelengths were chosen because they correspond to readily available, low-cost, user-friendly lasers; the 1064 nm wavelength corresponding to a continuous wave (CW) fiber laser and the 405 nm wavelength corresponding to a blue diode laser. Of course, lasers of other wavelengths between 400 nm and 2000 nm may also be used. The ink may also be applied by spin coating onto the glass substrate.

Next, at step 34, the laser beam 20 is directed through the substrate and through the ink film so that the region adjacent the interface between the absorber and film is heated. The laser beam can be processed using optical systems to give the beam a desired profile shape and also to focus the beam at the desired heating point. As illustrated diagrammatically in FIG. 2, the laser beam tapers to a focal point located at or near the interface 22 between the absorber material and the ink film coating. By delivering heat into this region, the absorber material becomes heated and that heat is then propagated back into the ink film, causing the ink film to anneal. Annealing boils away the organic solvents and at least partially melts the suspended metal oxide particles, causing them to fuse together and also causing them to fuse to and form a mechanical bond with the substrate. This is illustrated in FIGS. 10a-10d.

Referring to FIG. 10a, the exemplary coating material 12 may comprise nanoparticles of metal oxide 60 bonded together by an organic ligand 62. Thus the metal oxide 60 and ligand 62 exist as a dried ink film adhered to the substrate. Alternatively, a metal-oxide-organic compound or colloidal dispersion such as sol-gel can be used. As laser energy is applied to the absorber region 18, the temperature of the illuminated absorber region rises, causing heat to flow from absorber region 18 into the coating material 12. As shown in FIG. 10b, the heat begins to drive off the organic ligand 62, which escapes through the interstices throughout the absorber material. In the case where a sol-gel metal-oxide-organic compound or colloidal dispersion is used, the heat breaks any chemical bonds or other binding effects between metal oxide molecules and the organic materials, allowing the organics to escape. Eventually, as shown in FIG. 10c, substantially all of the organics are driven off and the metal oxide particles 60 begin to agglomerate or stick together. Finally, after sufficient annealing time has elapsed, the particles of metal oxide become fused together as at 60a in FIG. 10d. The fused metal oxide forms a mechanical bond with the substrate 10.

If desired, the absorber material 18 may include a doping material 64. As shown in FIGS. 11a-11d, this doping material propagates across the interface 22 during the annealing process, so that some of the doping material particles adhere to and become fused into the annealed metal oxide agglomeration as at 60b in FIG. 11d.

After the annealing process is complete, the substrate and film coating are removed from the containment vessel as shown at 36. Only that portion of the ink film that was adjacent the heated absorber will have undergone the annealing process. The remainder of the ink film remains substantially as originally applied at step 30. This is shown in greater detail in FIG. 12. As illustrated, the coating material 12 within the local region 24 where heating occurred is transformed into the annealed coating attached to substrate 10 as at 60a. However, outside the local region 24, the coating material 12 remains substantially as originally applied, comprising a mixture of metal oxide particles 60 with organic ligand 62, or as a metal-oxide-organic compound if a sol-gel coating was used.

At step 38, the portions of the ink film that were not annealed (i.e., regions outside the local area 24) are removed by washing in a suitable solvent such as octane.

Figure 3:
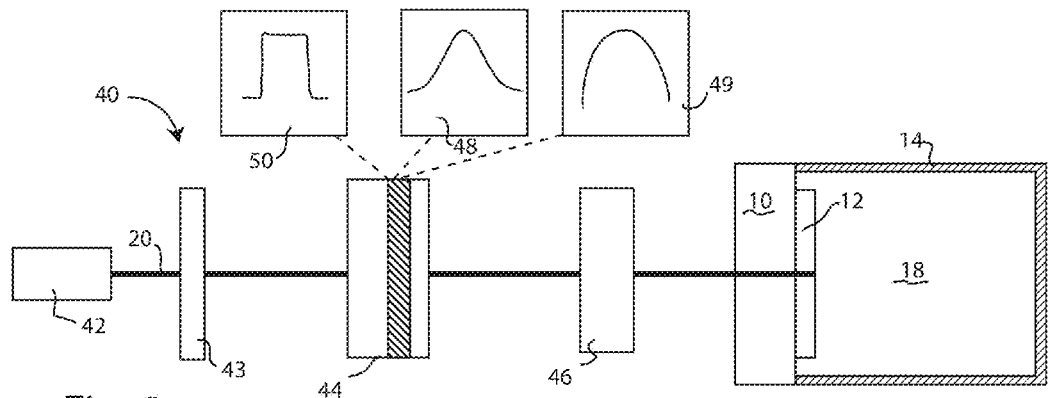
FIG. 3 is a plan view of a laser system useful in employing the disclosed process.

Referring to FIG. 3, a suitable laser system 40 will now be described. The laser 42 transmits a laser beam 20 through a series of optical elements including a collimator 43, optional beam shaper 44 and a focal lens 46 to precisely control the size and shape of the beam where it impinges upon the absorber material. Depending on the desired results, the beam shaper 44 can be set to produce, for example, a specific Gaussian beam profile depicted at 48, a bowl-top profile depicted at 49, top-hat profile depicted at 50 or other shapes. The Gaussian shape is preferred when it is desired to anneal the ink film in very fine lines upon the substrate. The top-hat shape is preferred when wider lines or larger regions are desired. If the natural Gaussian shape of the laser beam is desired for a particular application, the beam shaper 44 can be omitted; although the beam shaper can be used to alter a native Gaussian shape into other Gaussian shapes (e.g., different widths) as well.

By way of example, when using a 405 nm laser diode continuous wave (CW) laser, a Gaussian beam shape of 50 micrometers in diameter and a power of 0.5 watts will produce good results; alternatively, a 1D top-hat beam of approximately 500 micrometers by 50 micrometers at a power of 1.5 watts will also produce good results. By way of further example, when using a 1064 nm CW fiber laser, a Gaussian beam shape of 100 micrometers in diameter and a power of 3 watts will produce good results; alternatively, a 1D top-hat beam of approximately 800 micrometers by 90 micrometers at a power of 10 watts will also produce good results. Other laser wavelengths, other beam shapes and other power levels can be used.

Figure 4A:
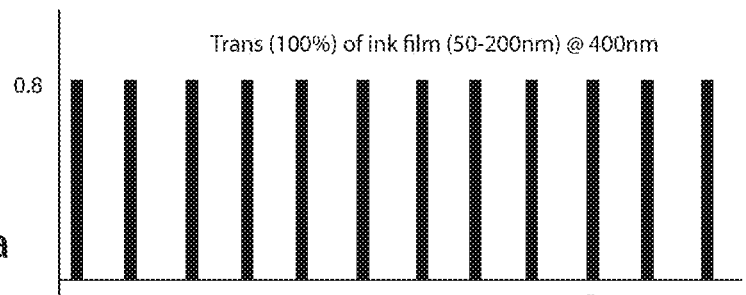
FIGS. 4a and 4b are optical transmission graphs, showing the transmissive properties of some commonly used metal oxide thin films with which the disclosed technique may be employed.
Figure 4B:
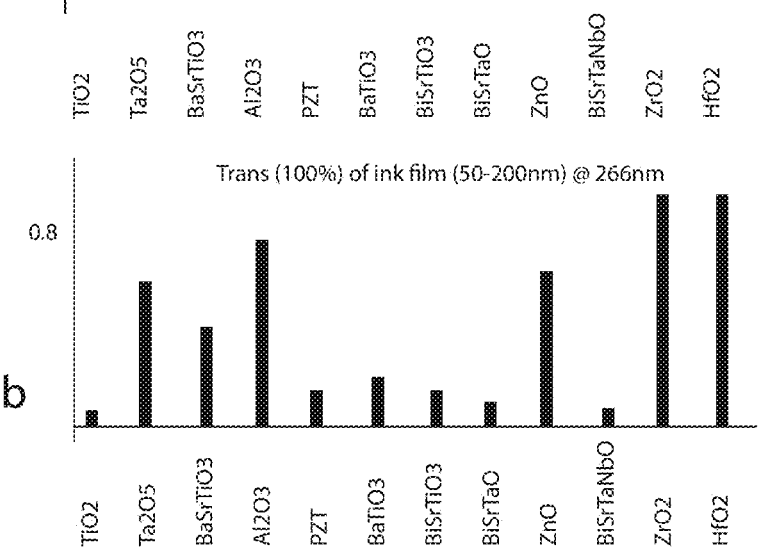

The coating material (e.g., ink film) can be fabricated using a wide variety of different metal oxides, with the principal requirement being that the material should be optically transmissive at the laser wavelength. Thus selection of the metal oxide material is tied to proper selection of the laser wavelength, and vice versa. By way of illustration, FIGS. 4a and 4b show the transmissivity of a number of popular metal oxides at 400 nm and 266 nm, respectively.

FIGS. 5a, 5b and 5c show some test results useful in understanding how laser power and profile shape affect the results. In FIG. 5a, two horizontal lines were annealed by moving the laser beam relative to the substrate in two horizontal passes using a 405 nm blue diode laser to anneal an Indium-Tin-Oxide (ITO) film. This may be accomplished, for example, by moving the laser relative to a stationary workpiece, or by moving the workpiece relative to a stationary laser. Note in FIG. 5a how the two horizontal annealed thin film structures are well formed with well-defined, sharp edges 54.

By way of comparison, FIG. 5b shows the results of annealing using a 1064 nm fiber laser to anneal the ITO film where the parameters were not tuned to produce sharp edges. Rather, the results in FIG. 5b show two horizontal annealed bands with rough, somewhat ill-defined edges. To achieve results of quality comparable to those shown in FIG. 5a, the laser power may be reduced, to eliminate annealing of the outer edges 54, or by selecting a top-hat beam profile, which would have the effect of annealing the outer edges 54 to approximately the same degree as the inner portion 56. Thus as illustrated in FIG. 5c, good annealing results are obtained using a 1064 nm fiber laser to anneal the ITO film where the parameters are tuned to produce sharp edges by adjusting the laser power and by using a top-hat profile.

There are a number of factors that can be controlled to achieve good results. These factors include: laser power, laser illumination time (which can be varied by controlling scan speed or rate at which workpiece moves relative to laser beam or vice versa), chemical makeup of absorber material (including material's optical absorption, heat capacity and thermal conductivity), and wavelength of laser light. As previously discussed, the absorber material is selected to absorb the laser energy and produce a rise in temperature at the interface where the coating material and absorber material meet. Preferably, the absorber material comprises a substance that is not, itself, chemically altered by the temperature rise.

The absorber is also preferably formulated or configured so that volatile organic solvents have an exit path through the absorber as the annealing process proceeds. In the illustrated embodiment, a fluid (liquid) absorber comprising carbon-based black ink is used. Other fluid materials having the desired absorbing properties may also be used, including dry powdered absorbers. Moreover, if desired, a solid absorber can be used; preferably, such solid absorber is equipped with pores or vent passages to allow the volatile organic solvents to escape.

FIGS. 6a, 6b and 6c show simulation results on how heat generated by laser beam absorption by the absorber and then to the coating is carried out. As shown in FIG. 6a, the laser beam 20 strikes the absorber material 18 at the interface 22 between the coating 12 and the absorber material 18. The basic thermodynamic heat transfer of this configuration may be modeled using the following values, where for estimation purposes the absorber material is thermodynamically modeled as water.

|  | $C_p$ (W/m*K) | $\kappa$ (J/kg*K) | $\rho$ (kg/m^3) |
|---|---|---|---|
| Film (coating) | 0.1 | 755 | 3975 |
| Glass (substrate) | Glass_coefficent (T) | 2540 | 708 |
| Water (absorber) | (T) (COMSOL material library) | (T) (COMSOL material library) | (T) (COMSOL material library) |

The laser beam 20 produces a heat bloom within the heating zone 80, which raises the temperature to the annealing temperature, which in turn causes a heat spike in the coating. FIGS. 6b and 6c show how the peak temperature transfers sufficient heat to the coating material to anneal the coating material. FIGS. 6b and 6c correspond to an example where the laser power of 3 watts was scanned across the workpiece surface at a rate of 5 millimeters per second. As shown in FIG. 6b, a tremendous heat is generated at the interface of the absorber and coating (film). Because the laser is moving relative to the workpiece the heating appears as a spike having a lifetime of approximately 40 milliseconds at full-width, half-maximum (FWHM). Note in FIG. 6b that the temperature accumulates as successive heat spikes cumulatively build up heat as the beam proceeds in the scanning direction.

FIGS. 7a and 7b show how the peak temperature decays across the absorber, metal oxide coating and substrate (glass) interfaces. The absorber-coating interface is shown at 22. As can be seen, the peak temperature of approximately 700 degrees Centigrade is delivered to the coating, with substantial fall-off in temperature in the absorber and substrate materials. FIGS. 7a and 7b thus illustrate how heat, sufficient to cause annealing of the coating material, is accurately delivered to the coating, without causing substantial heat build-up within the absorber and substrate materials.

Figure 8A:
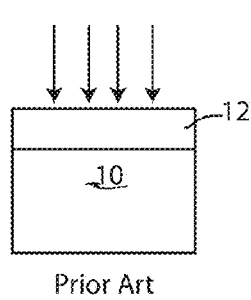
FIGS. 8a and 8b depict prior art front side annealing processes illustrating direct annealing and indirect annealing, respectively.
Figure 8B:
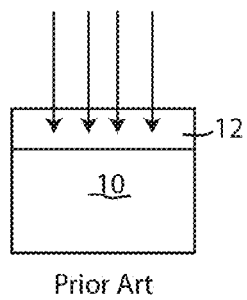
Figure 14:
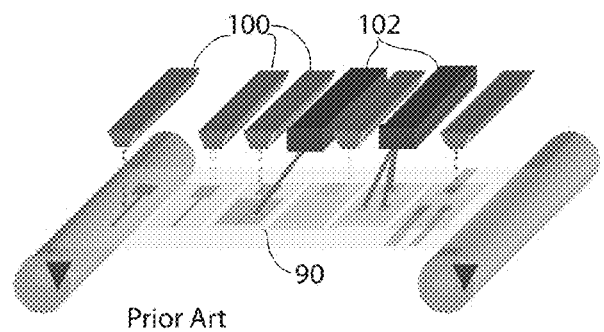
FIG. 14 depicts a prior art laser annealing process using front side annealing.

Backside laser annealing in accordance with the present disclosure offers distinct advantages, particularly where the substrate and coating materials are transparent. To illustrate this, refer first to FIG. 14 and to FIGS. 8a and 8b, which show how a conventional front-side laser annealing process is performed. In the front-side technique, the workpiece 90 is conveyed past a series of ink-jet devices 100 that apply a coating to the substrate. Then laser devices 102 deliver optical energy directly onto the coatings to cause them to anneal. Such front-side annealing can either be accomplished by heating the coating 12, as shown in FIG. 8a (referred to herein as direct front-side annealing), or by heating the substrate 10, as shown in FIG. 8b (referred to herein as indirect front-side annealing). The laser beam must strike the coating in the correct place in order to anneal the coating in the pattern desired. However, where the coating is transparent in the visible light spectrum, aligning of the laser beam with the ink coating can be difficult for a human operator to achieve. The difficulty is exacerbated where a laser outside the visible light spectrum is required to deliver energy at a wavelength that will be absorbed by the coating.

Figure 9:
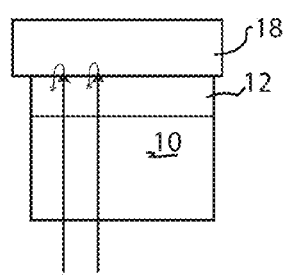
FIG. 9 depicts the backside annealing process of the present disclosure.
Figure 13:
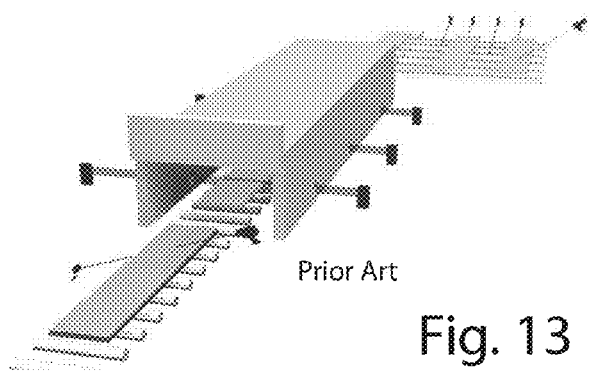
FIG. 13 depicts a prior art thermal annealing process using a furnace.

The backside annealing process of the present disclosure avoids this difficulty and is shown in FIG. 9 for comparison. Note that the optical energy is delivered to the absorber 18, on the backside of the coating 12. Note also how the direction of the laser beam is opposite that of the conventional front-side annealing processes. That is, the laser beam in FIG. 9 passes through the substrate before it passes through the coating to reach and heat the absorber. In the front-side processes of FIGS. 8a and 8b, the beam hits the coating 12 first, before reaching the substrate (if at all). Because heating is produced from the backside, transparency of the coating is not a problem. Thus low-cost, user-friendly lasers and laser diodes and fiber lasers which produce light in the visible light spectrum can be used.

Selection of a suitable laser and laser beam wavelength depends on the optical properties of the coating material and substrate. Since most transparent metal-oxide (TMO) materials are transparent from 400 nm to 2000 nm, only ultraviolet or far infrared laser beams are absorbed directly by the metal-oxide. Such wavelengths would be suitable for front-side annealing, as depicted in FIGS. 8a and 8b. However, to perform backside annealing as depicted in FIG. 9, the laser wavelength should be substantially transmissive through both the substrate and the coating material. Thus for most TMO materials the wavelength will be between 400 nm to 1550 nm. Suitable lasers for this purpose include 532-1064 nm diode-pumped solid state lasers (DPSS) and fiber lasers as well as 400-2000 nm laser diodes. These have the advantage of being low cost, user-friendly and suitable for high processing throughput.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of applying a film to a substrate, comprising:
    applying a coating material to a backside of a substrate;
    placing a liquid absorber material in heat transfer proximity to a backside of the substrate;
    using a laser to heat the liquid absorber material by transmitting the laser beam first through the substrate and then through the coating material to supply optical energy to the liquid absorber material; and
    using the heat from the liquid absorber material to alter the physical properties of the coating material such that the coating material forms a film adhered to the substrate.

2. The method of claim 1 wherein said laser produces a laser beam at a wavelength that is substantially transmissive through the substrate and through the coating material.

3. The method of claim 1 wherein the laser produces a laser beam at a predetermined wavelength and wherein the liquid absorber material comprises a material that is substantially absorptive at said predetermined wavelength.

4. The method of claim 1 wherein said liquid absorber material contains carbon particles in a fluid suspension.

5. The method of claim 1 wherein said liquid absorber material contains a dye of a color that substantially absorbs the laser light.

6. The method of claim 1 wherein said liquid absorber comprises nanoparticles that substantially absorb the laser light.

7. The method of claim 1 wherein said coating material comprises a metal oxide material.

8. The method of claim 1 wherein said coating material comprises a metal oxide material mixed with an organic binder to adhere the metal coating to the substrate.

9. The method of claim 1 wherein said coating material comprises a mixture of nanoparticles and an organic ligand.

10. The method of claim 1 wherein said coating material comprises a metal oxide material colloidally dispersed in a bonding material.

11. The method of claim 1 wherein said coating material comprises a combination of a metal oxide material and a sol-gel material.

12. The method of claim 1 further comprising introducing a doping material in said liquid absorber material.

13. The method of claim 1 further comprising adding a dopant material to the absorber prior to the step of using a laser to heat the liquid absorber material.

14. The method of claim 1 further comprising defining a containment chamber that includes at least a portion of the applied coating material and wherein the liquid absorber material is a fluid introduced into said containment chamber.

15. The method of claim 1 wherein the laser produces a laser beam at a wavelength of 405 nm.

16. The method of claim 1 wherein the laser produces a laser beam at a wavelength of 1064 nm.

17. The method of claim 1 wherein the laser produces a laser beam at a wavelength from 400 nm to 1550 nm.

18. The method of claim 1 further comprising adjusting the laser beam to have a predefined beam profile.

19. The method of claim 18 wherein the predefined beam profile is selected from the group consisting of Gaussian, top-hat and bowl-top.

20. The method of claim 1 further comprising using the heat from the liquid absorber material to anneal the coating material in a localized region of the coating material adjacent an interface between the applied coating material and the absorber.

21. The method of claim 1 further comprising focusing the laser beam at an interface between the applied coating material and the absorber.

22. The method of claim 1 further comprising controlling the duration of the transmission of the laser beam to supply optical energy to the liquid absorber material.

23. The method of claim 22 wherein duration is controlled by moving the laser beam relative to the substrate at a controlled rate or by moving the substrate relative to the laser beam at a controlled rate.

24. The method of claim 1 wherein the liquid absorber material has about the heat capacity of the coating material.

25. A method of applying a thin film to a substrate, comprising:
employing a laser that provides a laser beam at a predetermined wavelength that is substantially transmissive through said substrate;
selecting a coating material that is substantially transmissive at said predetermined wavelength and applying said coating material to said substrate to define a coated surface;
associating a containment vessel with the coated surface to define a fluid containment chamber that includes within its interior at least a portion of the coated surface;
selecting a fluid absorber material that is substantially absorptive at said predetermined wavelength and introducing said fluid absorber material into said containment chamber so that the fluid absorber material contacts said portion of the coated surface;
transmitting said laser beam through the substrate and also through the coating material to strike the fluid absorber material in a region substantially adjacent an interface between the fluid absorber material and coating material and thereby supply optical energy to the fluid absorber material causing the fluid absorber material to gain heat in the region where struck by the beam; and
allowing heat from said fluid absorber material to propagate to a localized region of coating material adjacent said interface in a quantity sufficient to anneal the coating material in the localized region.

* * * * *